(12) United States Patent
Chan et al.

(10) Patent No.: US 6,919,011 B2
(45) Date of Patent: Jul. 19, 2005

(54) COMPLEX WAVEFORM ELECTROPLATING

(75) Inventors: Kang Cheung Chan, Kowloon (HK); Kam Chuen Yung, Kowloon (HK); Tai Men Yue, Kowloon (HK)

(73) Assignee: The Hong Kong Polytechnic University, Kowloon (HK)

( * ) Notice: Subject to any disclaimer, the term of this patent is extended or adjusted under 35 U.S.C. 154(b) by 339 days.

(21) Appl. No.: 10/026,953

(22) Filed: Dec. 27, 2001

(65) Prior Publication Data

US 2003/0121792 A1 Jul. 3, 2003

(51) Int. Cl.[7] .................................................. C25D 5/18
(52) U.S. Cl. ........................ 205/103; 205/96; 205/102; 205/148
(58) Field of Search ............................... 205/103, 148, 205/102, 96

(56) References Cited

U.S. PATENT DOCUMENTS

| | | | | |
|---|---|---|---|---|
| 4,466,864 A | * | 8/1984 | Bacon et al. | 205/105 |
| 5,705,230 A | * | 1/1998 | Matanabe et al. | 427/438 |
| 6,071,398 A | * | 6/2000 | Martin et al. | 205/103 |
| 6,099,711 A | * | 8/2000 | Dahms et al. | 205/101 |
| 6,251,250 B1 | * | 6/2001 | Keigler | 205/89 |
| 6,491,806 B1 | * | 12/2002 | Dubin et al. | 205/296 |
| 6,620,303 B2 | * | 9/2003 | Wong et al. | 205/67 |
| 2001/0015321 A1 | * | 8/2001 | Reid et al. | 205/103 |

FOREIGN PATENT DOCUMENTS

| WO | WO 9954527 A2 | * 10/1999 | C25D/17/00 |
|---|---|---|---|

OTHER PUBLICATIONS

U.S. Appl. No. 09/860,758, filed May 21, 2001, Wong et al.

* cited by examiner

Primary Examiner—Nam Nguyen
Assistant Examiner—Brian L Mutschler
(74) Attorney, Agent, or Firm—Leydig, Voit & Mayer, Ltd.

(57) ABSTRACT

A method of electroplating an object includes providing a electroplating bath solution with one or more anodes therein, disposing an object to be electroplated in the bath, and passing a complex current waveform between the anode nodes and the object. The waveform is a cyclic alternating type having two portions, a positive triangular shaped portion including one or more spikes and a negative portion. The method further includes vibrating the object and/or agitating the bath solution.

12 Claims, 6 Drawing Sheets

Conditions - Triangular wave 5ASD with 11.25ASD multi-peak and 12ASD reverse current density 80min(with agitation and vibration)

| | |
|---|---|
| Triangular base height | 5ASD |
| Spike height | 11.25ASD |
| Spike width | 0.67ms |
| Spike distribution | Evenly distributed |
| No. of spike | 6 |
| Reverse current density | 12ASD |
| Forward current on time | 20ms |
| Reverse current on time | 1ms |
| Plating time (with agitation and vibration) | 80 min |

Conditions - Square wave (with agitation)

| Forward current density | 3ASD |
|---|---|
| Reverse current density | 8.4ASD |
| Forward current on time | 20ms |
| Reverse current on time | 1ms |
| Plating time | 80 min |

Conditions - Triangular wave 2ASD with 12ASD reverse current density (with agitation)

| | |
|---|---|
| Triangular base height | 2ASD |
| Spike height | 4ASD |
| Spike width | 0.67ms |
| Spike distribution | At the start of forward current |
| No. of spike | 1 |
| Reverse current density | 12ASD |
| Forward current on time | 20ms |
| Reverse current on time | 1ms |
| Plating time | 315 min |

Conditions - Triangular wave 2ASD with multi-peak and 12ASD reverse current density (with agitation)

| | |
|---|---|
| Triangular base height | 2ASD |
| Spike height | 4.5ASD |
| Spike width | 0.67ms |
| Spike distribution | Evenly distributed |
| No. of spike | 6 |
| Reverse current density | 12ASD |
| Forward current on time | 20ms |
| Reverse current on time | 1ms |
| Plating time | 315 min |

Conditions – Triangular wave 5ASD with 11.25ASD multi-peak and 12ASD reverse current density 80min(with agitation and vibration)

| Triangular base height | 5ASD |
|---|---|
| Spike height | 11.25ASD |
| Spike width | 0.67ms |
| Spike distribution | Evenly distributed |
| No. of spike | 6 |
| Reverse current density | 12ASD |
| Forward current on time | 20ms |
| Reverse current on time | 1ms |
| Plating time (with agitation and vibration) | 80 min |

| Hole diameter (μm) | Throwing Power | | | | Microsection Photo | | | |
|---|---|---|---|---|---|---|---|---|
| | 150 | 100 | 75 | 50 | 150 | 100 | 75 | 50 |
| Waveform 1<br>Square wave (with agitation) | 73.18 | 75.64 | 68.24 | 50.35 |  | 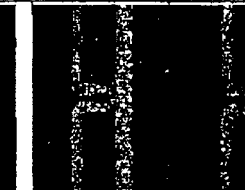 |  |  |
| Waveform 2<br>Triangular wave 2ASD with 12ASD reverse current density (with agitation) | 103.15 | 91.28 | 78.4 | 52.76 | 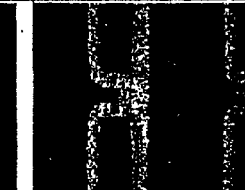 |  |  |  |
| Waveform 3<br>Triangular wave 2ASD with multi-peak and 12ASD reverse current density (with agitation) | 129.13 | 135.59 | 125.54 | 70.52 |  | 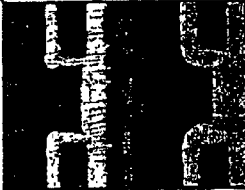 | 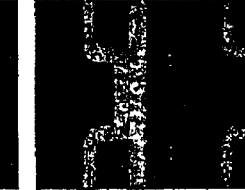 |  |
| Waveform 4<br>Triangular wave 5ASD with 11.25ASD multi-peak and 12ASD reverse current density (with agitation and vibration) | 94.42 | 82.32 | 84.55 | 70.52 | | | | |

TABLE 1

COMPLEX WAVEFORM ELECTROPLATING

FIELD OF THE INVENTION

The invention relates to electroplating, and in particular to electroplating of printed circuit boards (PCBs) and printed wiring boards (PWBs). In one particular aspect the invention relates to electroplating through-holes and blind holes in PCBs/PWBs.

BACKGROUND TO THE INVENTION

Holes in PCBs/PWBs provide two primary functions. Firstly, they accommodate mounting pins for electronic components, and secondly, they provide routing paths between circuit on multi-layer printed circuit boards. Typically these holes can generally be referred to as through-holes and blind holes(or in the case of PWBs, Vias and blind vias). A layer of copper is deposited within the holes by electroplating. There are a number of well-establish techniques within the PCB manufacturing industry for copper electroplating the holes in PCBs. These typically involve a large number of chemical processes before the final electroplating process and such are well within the acknowledge of the skilled addressee.

Known electroplating techniques employ both direct current (DC) and a more recently periodic pulse reverse currents. Although the latter method can eliminate some of the plating defects such as such as low throwing power (the ratio of plating thickness/distribution on the PCB surface to the plating thickness/distribution within the holes), poor distribution across the PCB surface, poor levelling, plating nodules (resulting in a rough finished surface), poor uniformity of copper grain structure and inability to electro-deposit on an even deposit in the holes, some of these defects still occur in plating vias in the micro range.

One particular problem associated with known electroplating processes is the tendency of electrical charges to build up on any imperfections or high-spots on the object/surface being plated. This increased electrical charge attracts more copper than the surrounding areas, which results in a poor finish to the surface of the copper.

In PCB manufacturer it is desirable to use a thick dielectric layer, and thus a thick PCB board, to ensure better functional and electrical performance. This results in high aspect ratio through-holes. A further problem with known electroplating techniques is achieving good plating distribution and a defect-free deposition within the high aspect ratio holes. Holes also represent an "imperfection" in the PCB surface and are prone to a build-up of copper as mentioned earlier.

SUMMARY OF THE INVENTION

It is an object of the present invention to provide a method of electroplating that provides good plating distribution, particularly within through-holes and blind holes. A further object of the present invention is to at least ameliorate the above-mentioned disadvantages with known electroplating techniques, or at least to provide the public with a useful alternative.

According to a first aspect of the invention there is provided a method of electroplating wherein a complex current waveform is passed between an anode and an object being electroplated. The waveform is a cyclic alternating type having two portions, a positive portion including one or more spikes and a negative portion.

Preferably, the positive portion is a triangular shape.

Preferably, the positive portion has a peak value of substantially 5ASD, the spikes have peak values of substantially 11.25ASD, and a negative portion has a peak value of substantially 12ASD.

According to a first aspect of the invention there is provided a method of electroplating an object including:

providing a electroplating bath solution with one or more anodes therein, disposing an object to be electroplated in the bath, and passing a complex current waveform between the anode nodes and the object.

The waveform is a cyclic alternating type having two portions, a positive triangular shaped portion including one or more spikes and a negative portion.

Preferably, the method further includes vibrating the object and/or agitating the bath solution.

Further aspects of the invention will become apparent from the following description, which is given by way of example only.

BRIEF DESCRIPTION OF THE DRAWINGS

Embodiments of the invention will now be described by way of example only and with reference to the accompanying drawings and table in which.

DESCRIPTION OF THE PREFERRED EMBODIMENTS

Figure 1:
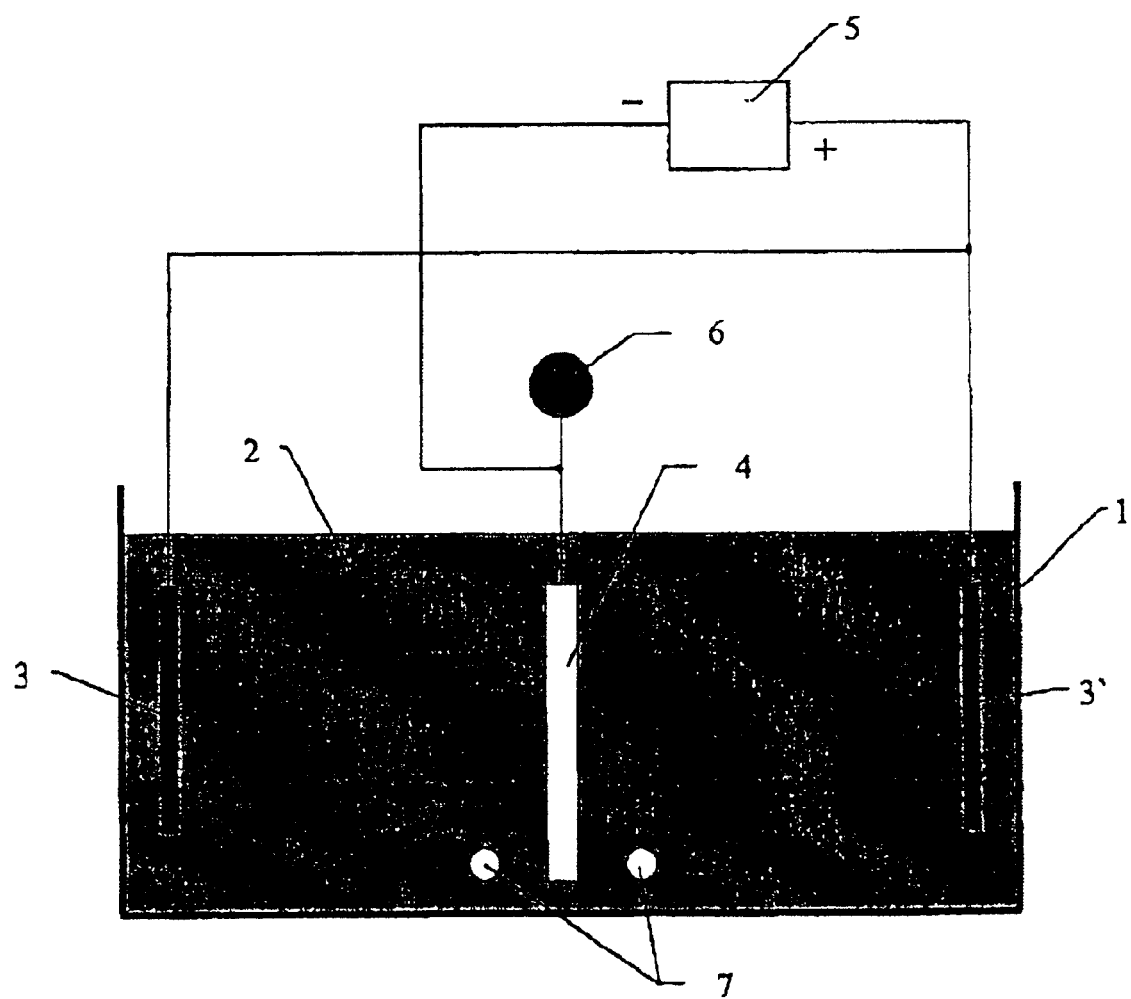
FIG. 1 illustrates a schematic of an electroplating system.
Figure 2:
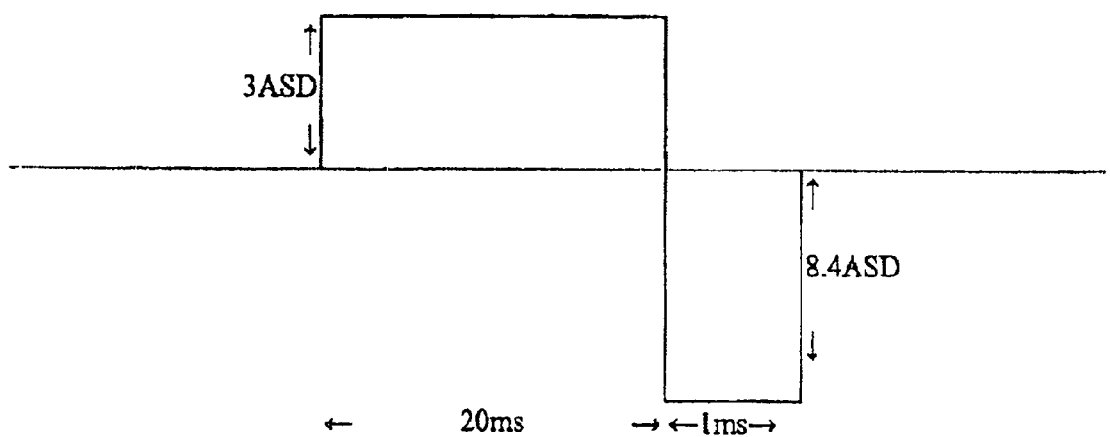
FIG. 2 illustrates the Square wave (Waveform 1)
Figure 3:
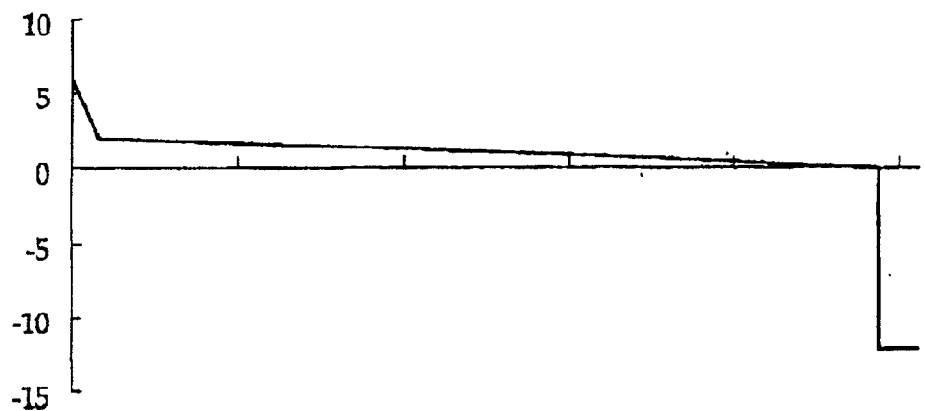
FIG. 3 illustrates the Triangular wave of 2ASD with 12ASD reverse current density (Waveform 2)
Figure 4:
FIG. 4 illustrates the Triangular wave of 2ASD with multi-peaks and 12ASD reverse current density (Waveform 3)

Referring to FIG. 1, an electroplating system includes a tank or bath 1 containing electroplating solution 2. Disposed within the solution 2 at convenient locations are anodes 3. The solution and anode material are of a type suitable for the electroplating process. Such are well known in the art. For copper electroplating the solution 2 might be copper sulphate with copper anodes 3. The solution 2 may also contain a brightener and carrier in known manner.

An object 4, which is to be electroplated, is disposed within the tank and solution 2, and forms the cathode. A current source 5 provides an electrical current which is passed through the solution 2 between the anodes 3 and object 4.

The present invention uses complex current waveforms in the electroplating process instead of a single type of DC or pulse waveform. Complex waveforms are alternating waveforms of an arbitrary shape whose form changes with time during the plating process. In the preferred embodiment of the invention the complex waveforms are cyclic with a triangle positive portion and a square negative portion. The positive portion has multiple positive spike currents.

Figure 5:
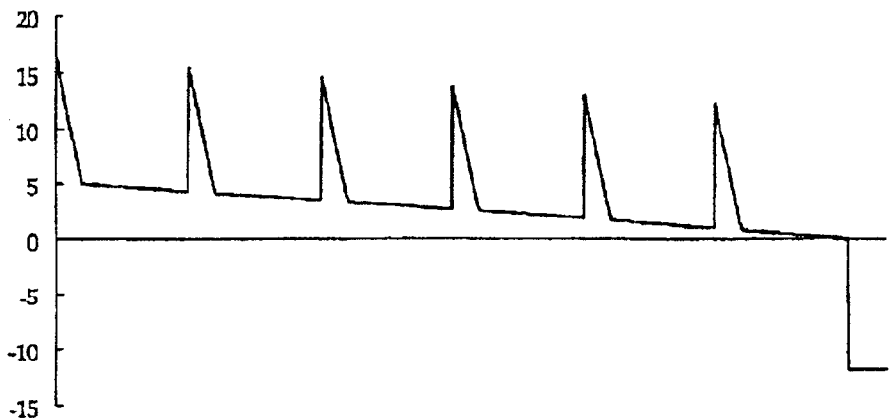
FIG. 5 illustrates the Triangular wave of 5ASD with 11.25ASD multi-peak and 12ASD reverse current density (Waveform 4), and Table 1 is a summary of the throwing power and hole distribution results for Waveforms 1 to 4.

The waveform of the preferred embodiment is shown in FIG. 5. It comprises 6 current spikes of magnitude 11.25ASD superimposed in a positive triangular waveform with an initial peak magnitude of 5ASD and a period of 1 millisecond. The negative portion of the cycle is a square waveform of 12ASD magnitude and 1 millisecond period.

The preferred embodiment also includes a vibrator 6 to vibrate the object 4 and an agitator 7 to agitate the electroplating solution 2. In the preferred embodiment the agitator may be air agitation.

The benefits of the current invention are illustrated by the following five tests, which are given by way of example only. The waveforms of the tests are shown in FIGS. 2 to 5. The test apparatus was an electroplating system substantially as that shown in FIG. 1, using a Printed Wiring Board as object 4. The results are shown in Table 1, which compares Throwing Power and distribution with a blind Via for each waveform tested.

A typical square waveform (FIG. 2) and two triangular waveforms (FIGS. 3 and 4) were used for copper plating blind Vias with diameters ranging from 50 and 150 μm in a PWB and the typical square wave was used as a control. The throwing power and the copper distribution inside the Via were compared in the tests and shown in Table 1.

The triangular wave (Waveform 2) and triangular wave with spike (Waveform 3) show improved throwing power in both 50, 75, 100 and 150-micron microvias. Waveform 3 has high throwing power and a good profile of copper deposit inside the via.

Better agitation of the electroplating solution can improve the throwing power. Vibration of the object is further applied to the Waveform 4. The results are shown in Table 1. The trial with the triangular wave 5ASD with 11.25ASD multi-peak and 12ASD reverse current density did not show improvement in throwing power as compared with Waveform 3, but a very good profile of copper deposit inside the 50-micron via was obtained and the base of the 50-micron via was completely covered with copper deposits.

Embodiments of the invention have been described, however it is understood that variations, improvement or modifications can take place without departure from the sprite of the invention or scope of the appended claims.

We claim:

1. A method of electroplating comprising passing a current having a complex waveform between an electrode and an object being electroplated, the complex waveform alternating between a positive portion and a negative portion, the positive portion comprising a triangular waveform having an initial peak value and that decreases from the peak value at a constant rate, and at least one spike superimposed on the triangular waveform.

2. The method of claim 1 wherein the triangular waveform has an initial current density of substantially 5ASD and the spike has a maximum current density of substantially 11.25ASD.

3. The method of claim 1 wherein the triangular waveform has a period of substantially 1 millisecond.

4. The method of claim 1 wherein the negative portion of the complex waveform has a substantially uniform current density of substantially 12ASD.

5. The method of claim 1 wherein the negative portion of the complex waveform has a period of substantially 1 millisecond.

6. A method of electroplating an object including:
   placing an object to be electroplated in an electroplating bath;
   placing an electrode in the electroplating bath; and
   passing a current having a complex waveform between the object being electroplated and the electrode, the complex waveform alternating between a positive portion and a negative portion, the positive portion comprising a triangular waveform having an initial peak value and that decreases from the peak value at a constant rate, and at least one spike superimposed on the triangular waveform.

7. The method of claim 6 wherein the triangular waveform has an initial current density of substantially 5ASD and the spike has a maximum current density of substantially 11.25ASD.

8. The method of claim 6 wherein the triangular waveform has a period of substantially 1 millisecond.

9. The method of claim 6 wherein the negative portion of the complex waveform has a substantially uniform current density of substantially 12ASD.

10. The method of claim 6 wherein the negative portion of the complex waveform has a period of substantially 1 millisecond.

11. The method of claim 6 including vibrating the object while passing the current between the object and the electrode.

12. The method of claim 6 including agitating the electroplating bath while passing the current between the object and the electrode.

* * * * *

UNITED STATES PATENT AND TRADEMARK OFFICE
CERTIFICATE OF CORRECTION

PATENT NO. : 6,919,011 B2
DATED : July 19, 2005
INVENTOR(S) : Chan et al.

It is certified that error appears in the above-identified patent and that said Letters Patent is hereby corrected as shown below:

<u>Title page,</u>
Item [75], Inventors, change "Tai Men Yue" to -- Tai Man Yue --.

Signed and Sealed this

Twenty-second Day of November, 2005

JON W. DUDAS
*Director of the United States Patent and Trademark Office*